CONTINUOUSLY GRADED ELECTRODE OF TWO METALS FOR SEMICONDUCTOR DEVICES

Filed Oct. 1, 1963 2 Sheets-Sheet 1

Inventors
BERNARD D. MILLS
ROLAND F. PAYNE
By Percy P. Lantzy
Attorney

Inventors
BERNARD D. MILLS
ROLAND F. PAYNE
By [signature]
Attorney 3,270,256

CONTINUOUSLY GRADED ELECTRODE OF TWO METALS FOR SEMICONDUCTOR DEVICES

Bernard Douglas Mills and Roland Francis Payne, London, England, assignors to International Standard Electric Corporation, New York, N.Y., a corporation of Delaware Filed Oct. 1, 1963, Ser. No. 312,930
Claims priority, application Great Britain, Oct. 19, 1962, 39,650/62
9 Claims. (Cl. 317—234)

Figure 1:
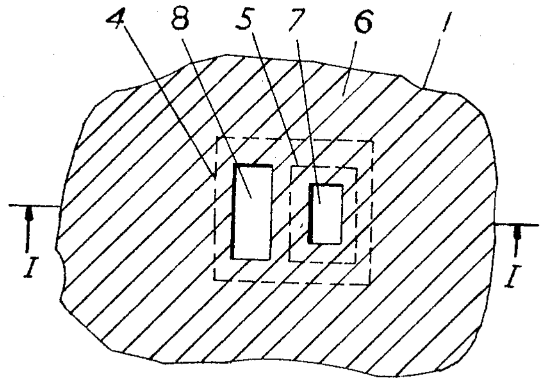

The present invention relates to semiconductor devices and electrical circuit structures including semiconductor devices, and to thin metallic films applied as large area contacts and conductors on such devices and circuit structures. More particularly, the invention relates to semiconductor devices and solid state circuits made by the planar process.

By the planar process in this specification is meant a process of forming active semiconductor devices and possibly also passive components by successive diffusions in a continuous body, preferably a single crystal body, of semiconductor material such that all the rectifying junctions and at least some of the electrodes are brought to a common plane surface of the semiconductor body. Each diffusion is made into the semiconductor through a hole, etched by photolithographic techniques, in a protective oxide layer on the semiconductor. The rectifying junction formed by this diffusion comes to the surface of the semiconductor under the oxide layer, which is regrown over the semiconductor. A hole is then made in the oxide in the required position for the next diffusion. When all the required devices and components have been thus formed, holes are finally made in the oxide to expose the necessary electrodes while leaving all the rectifying junctions protected by the oxide layer. Metallic contacts are then made to the exposed electrodes.

Where only one semiconductor device is produced, in the case of a diode at least one of the two electrodes will be exposed through the oxide layer, and in the case of a transistor with collector, base and emitter regions at least the base and emitter electrodes will be exposed through the oxide layer. Connections have then to be made from these exposed electrodes to the terminals of the final device, usually by means of fine wires. The exposed electrode areas are small and therefore it is advantageous to have large area deposited thin metallic film contacts which cover the exposed electrodes and extend over the oxide layer. Among the properties required of this metallic film are that it is both adhesive to the exposed electrodes and the oxide layer, and soft solderable.

By a solid state circuit in this specification is meant a single crystal block of semiconductor material in which are formed more than one electrical element, that is to say at least one active device (transistor(s) and/or diode(s)), which elements are inseparably associated on or within the semiconductor material to perform the function of a circuit.

In a process of planar double diffusion, the substrate semiconductor material forms the common collector region of any transistors and is also common with one of the electrode regions of any diodes, if these are formed by the first diffusion. In a process of triple diffusion, the first diffusion is employed for any required isolation of components. In either process, isolated surface regions may be employed as resistances and the depletion layers of reversed biased rectifying junctions may be employed as capacitors.

Those electrodes which are exposed through the oxide layer require large area metallic film contacts as described above with regard to single semiconductor devices, inter-connections also have to be made over the oxide layer to complete the required circuit configuration, and it is convenient to produce the contacts and interconnections by a single deposited pattern of thin metallic film. It is also possible to form passive components by thin-film circuit techniques over the oxide layer on the semiconductor.

According to U.S. patent application No. 278,206, filed May 6, 1963, a thin metallic film deposit is produced on an insulating substrate which is both strongly adherent to the substrate and easily solderable: this film includes a graded layer of two metals, one of the metals being adhesive to the substrate material and the other being a soft solderable metal, the layer being graded in content such that the relative proportion of adhesive metal with respect to the soft solderable metal decreases through the layer with increase in distance from the substrate. In particular, a graded film of chromium and gold is produced on a glass plate by a process of vacuum deposition which includes allowing the two metals to mix first in the vapour phase. Examples are described of this film forming the interconnection pattern of a thin film circuit on the glass plate and/or overlapping the already deposited aluminium film which forms one electrode of a thin film aluminium/silica/aluminium capacitor on the glass plate.

According to one aspect of the present invention, which is a modification of the invention described in U.S. patent application 278,206, there is provided a semiconductor body comprising a semiconductor device made by the planar process as herein defined and having an area or areas of thin metallic film deposited over the surface layer of oxide and extending to the electrode or electrodes exposed through the oxide to form a large area contact or contacts for the electrode or electrodes, wherein the metallic film is of the graded construction described in U.S. patent application No. 278,206, and/or is made by the method described in said application.

According to another aspect of the invention there is provided a semiconductor body comprising a solid state circuit as herein defined, made by the planar process as herein defined, and having a pattern of thin metallic film deposited over the surface layer of oxide and extending to the electrodes exposed through the oxide to form both large area contacts for the electrodes and an interconnection pattern for the circuit, wherein the metallic film is either of the graded construction described in U.S. patent application No. 278,206 or is made by the method described in said application.

Figure 2:
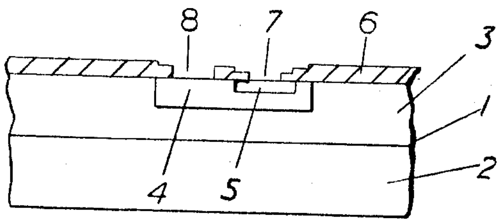
Figure 3:
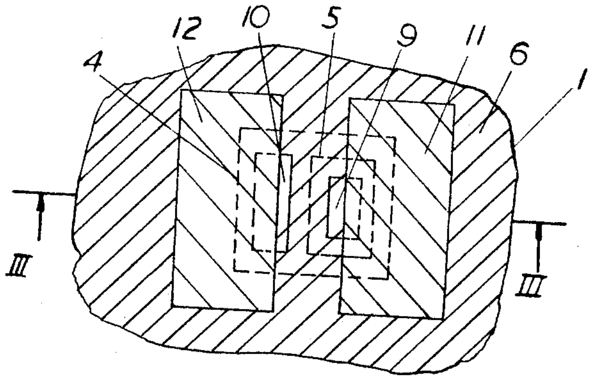
Figure 4:
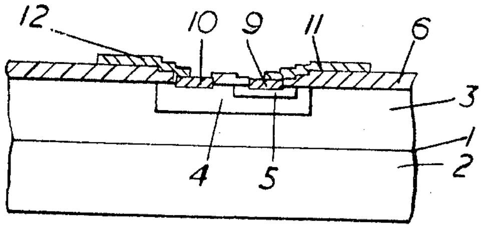
Figure 5:
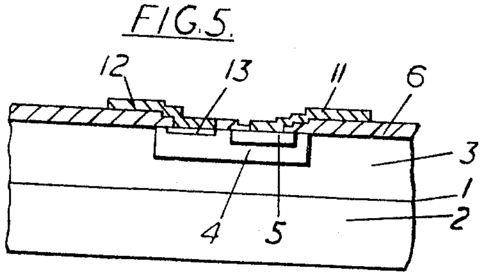
Figure 6:
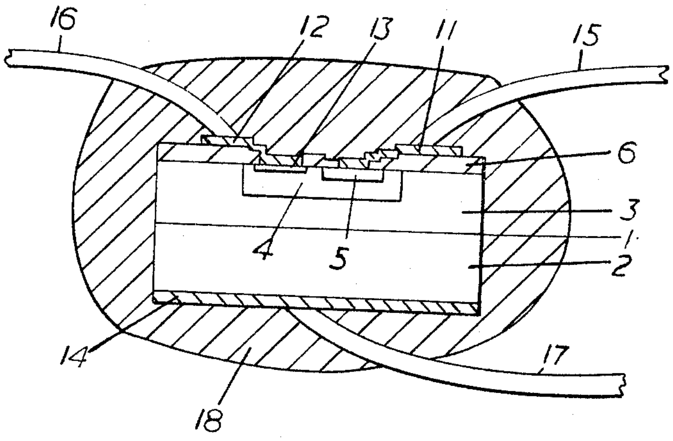

Embodiments of the present invention will now be described, by way of example, with reference to the accompanying drawings in which:

FIG. 1 shows a plan view of part of a wafer of silicon, containing an epitaxial planar transistor, before contacts have been made to the electrodes, FIG. 2 shows a cross-sectional view of FIG. 1, taken along the line I—I, FIG. 3 shows a plan view of part of a wafer of silicon, containing an epitaxial planar transistor, and with large area contacts, according to the present invention, overlying contacts which have been made to the emitter and base electrode areas, FIG. 4 shows a cross-sectional view of FIG. 3, taken along the line III—III, FIG. 5 shows a cross-sectional view of a wafer of silicon, containing an epitaxial planar transistor, with large area contacts, according to the present invention, directly overlying the emitter and base electrode areas, and FIG. 6 shows a cross-sectional view of an epitaxial planar transistor die, with large area contacts, according to the present invention, directly overlying the emitter, base and collector electrode areas, with leads soldered to these contacts, and the whole potted in resin.

Referring now to FIGS. 1 and 2, there is shown a wafer 1 of silicon consisting of an over-doped n-type substrate 2 of low resistivity, i.e. $n^+$-type of about 0.003 ohm-cm. resistivity, on which there has been grown, by the epitaxial technique, an n-type layer 3 of about 1 to 2 ohm-cm. resistivity; the layer 3 forms the collector region of a transistor. The p-type base region 4 and the n-type emitter region 5 have been formed by a known process of double diffusion, and the two rectifying junctions are protected by a layer of silicon oxide 6. The dotted outlines of FIG. 1 show the area of the base and emitter regions, 4 and 5 respectively. The particular process of double diffusion may be summarised as follows. The entire surface of the silicon wafer 1 is first oxidised to form an oxide layer 6; a photo-resist is applied to this oxide layer, and the photo-resist is then exposed to light through a mask having an opaque area corresponding to the area from which the oxide is to be removed. In developing, the unexposed photo-resist is removed, and chemical etching is then employed to remove the oxide layer 6 from the unexposed area, thus forming a "window" in the oxide layer, and the developed photo-resist is then removed by a solvent. A p-type impurity is then diffused through this "window" to form the base region 4, this diffusion being performed in an oxidising atmosphere which covers over the entire surface of the silicon wafer 1 with the oxide layer 6. Selective etching with the aid of the photo-resist and a mask is then repeated and the emitter region 5 is formed by diffusing in an n-type impurity while again covering the surface of the silicon wafer 1 with the oxide layer 6.

The process of double diffusion results in the base region 4 having a higher impurity carrier concentration than the collector region 3, corresponding to about 0.5 ohm-cm. resistivity; and the emitter region 5 having a higher still impurity carrier concentration, corresponding to a resistivity of about 0.01 ohm-cm.

By selective etching once again with the aid of the photo-resist and a mask, the surface of the wafer 1 is left covered by the oxide layer 6 except for exposed emitter and base electrode areas, 7 and 8 respectively. The resulting structure is that of an npn epitaxial planar transistor formed in a wafer of silicon, before contacts have been made to the electrodes. Only a portion of the silicon wafer 1, containing a single transistor structure, is shown; in fact a number of such structures are formed simultaneously in the wafer.

Referring now to FIGS. 1, 2, 3 and 4 a first method will be described of forming contacts on the exposed emitter and base electrode areas 7 and 8 of the transistor structure shown in FIGS. 1 and 2. The same reference numbers are given in FIGS. 3 and 4 to those parts of the structure which are the same as those in FIGS. 1 and 2. Aluminium is first evaporated over the whole top surface of the structure shown in FIGS. 1 and 2. Then, by selectively etching with the aid of a photo-resist and a mask which is the reverse of that used to expose the electrode areas 7 and 8, the electrode areas 7 and 8 are left covered with a film of aluminium. The structure is then heated to form an alloy at the aluminium-silicon interface so that good ohmic emitter and base contacts 9 and 10 (FIGS. 3 and 4) are formed.

The next stage is to form large area metallic film contacts 11 and 12 which overlap the aluminium contacts 9 and 10 and the oxide layer 6. This is achieved by the following process.

The silicon wafer, containing the transistor structure together with the aluminium emitter and base contacts, is chemically cleaned on the face containing these contacts and is then suspended in an inverted glass bell-jar with this face directed towards a pair of molybdenum boats containing respectively chemically cleaned chromium, and gold. The molybdenum boats are located in thermal contact with respective heating coils which are fed from an electrical supply by separately controllable variable resistances.

The prepared face of the silicon wafer is partially masked by a plate which is apertured to allow the vapours to reach the portion of the wafer on which it is desired to deposit the film. An adjustable shutter is positioned so as to shield the wafer from the vapours when the molybdenum boats are hot but no deposition is desired.

In operation, the bell-jar is first evacuated to a pressure of about $2\times10^{-5}$ torr and then the chromium-filled boat is preheated while the shutter shields the wafer. Deposition is then allowed to take place according to the following time schedule: (1) the wafer is un-shuttered and chromium alone is deposited; (2) the gold filled boat is then heated so that chromium and gold are deposited; (3) the temperature of the gold-filled boat is raised so that a higher proportion of gold is deposited; and (4) the current to the coil heating the chromium-filled boat is switched off so that as its temperature falls a smaller proportion of chromium is deposited, until finally only gold is deposited.

In this method of deposition the initial stage of preheating the chromium boat may possibly be dispensed with. Also, the separate heating coils could be dispensed with by passing the heating current directly through the molybdenum boats.

In the above described method of deposition of the chromium-gold film an apertured mask has been used to limit the deposition to the required areas. An alternative is to evaporate chromium-gold over the whole surface of the wafer, and then selectively etch with the aid of a photo-resist to obtain the required areas.

Referring again to FIGS. 3 and 4 the large area metallic film contacts 11 and 12, produced by the above described method, consist of an initial layer of pure chromium which adheres well to the aluminium contacts 9 and 10 and to the slilicon oxide layer 6 and a final layer of pure gold which is both highly conducting and soft solderable. Between these two pure layers there are a range of alloy compositions which have been obtained by the vapour phase mixing of the two metals. The film is mechanically stable and resistant to rupture when subjected to tensile stresses, exhibiting a tensile strength superior to that of the contacts employed in semiconductor devices heretofore known, and it is believed that this is due to the graded structural composition of the film.

Referring now to FIGS. 1, 2 and 5, a second method of forming contacts on the emitter and base electrode areas 7 and 8 of the transistor structure shown in FIGS. 1 and 2 will now be described. In this method, the step of forming aluminium contacts as in the method described above, is omitted. After the exposure of the emitter and base electrode areas 7 and 8, an intermediate step is performed which consists in diffusing a heavy concentration of p-type impurity material into the exposed base electrode area 8 to produce a very thin surface layer 13 of low resistivity approximately equivalent to that of the emitter region 5. The chrominum gold film is then deposited directly on to the exposed silicon emitter and base regions 7 and 8, and onto the silicon oxide layer 6, to form the large area metallic film contacts 11 and 12, as shown in FIG. 5. The chromium gold film is found to adhere well to the silicon surface as well as to the silicon oxide layer 6. The low resistivity surface layer 13 is necessary, in this case, to provide good ohmic contact between the silicon and the chromium gold film. Due to the double diffusion method of producing the emitter region 5, this already has a high impurity carrier concentration and therefore sufficiently low resistivity to make good ohmic contact with the chromium gold film.

There have been described above, two methods of forming large area metallic film contacts on to the emitter and base electrode areas of an epitaxial planar transistor structure formed in a silicon wafer. These methods would, of course, work equally well for a planar transistor structure without the extra, low resistivity, region 2, i.e. a non-epitaxial planar transistor structure.

In completing the manufacture of transistor devices it is necessary to provide an ohmic contact for the cellector electrode as well. This may be done by the known method of cutting the individual transistor die from the silicon wafer and attaching the collector electrode surface of each transistor die to a metallic header forming an ohmic collector contact; these may be attached to the headers, for example, by the method of friction alloying.

An alternative process, which lends itself well to the transistor structures described above, is to vacuum deposit a graded chromium gold film contact, in the manner described above, on to the collector electrode surface of the silicon wafer i.e. on the surface of the silicon wafer opposite that containing the emitter and base electrodes. In this case it has been found preferable to polish the collector electrode surface before deposition. In the case of an epitaxial planar transistor, good ohmic contact will be made between the chromium gold film and the low resistivity region 2. In the case of a planar transistor without the low resistivity region 2, it will be necessary to first diffuse a heavy concentration of impurity material, of the same conductivity type as the collector region, into the collector region to form a very thin surface layer of low resistivity e.g. about 0.005 ohm-cm. When the individual transistor dies are cut from the wafer, the metallic film contact may be easily soldered on to a header; alternatively a wire lead may be soldered direct to the metallic film contact.

Referring now to FIG. 6 there is shown a transistor die cut from a silicon wafer as shown in FIG. 5 with a chromium-gold film ohmic collector contact 14. Silver wires 15, 16 and 17, have been soldered to the emitter, base and collector contacts respectively and the whole potted in a globule of resin 18. Thus a transistor device is provided which, so far as attaching contacts and leads and encapsulating is concerned, lends itself to comparatively easy manufacture. The transistor die as described with reference to FIG. 6, with the deposited chormium gold film ohmic collector contact 13 but without lead wires and encapsulating resin, is in a convenient form for mounting on to a glass substrate; particularly by soldering on to a chromium-gold film contact, formed on the glass substrate, according to the above-mentioned U.S. patent application No. 278,206.

The collector electrode may be formed on the same surface of the silicon wafer as that containing the emitter and base electrodes. This may be done simply by exposing another electrode surface in the same way as for the electrode surfaces 7 and 8 (FIGS. 1 and 2). Then three large area metallic film contacts will be deposited instead of two (11 and 12 on FIGS. 3, 4 and 5). The necessary extra, low resistivity, surface region may be diffused in the same manner as that described for the base electrode (see FIG. 5).

The description, so far, has been limited to transistor structures. The chromium gold film may also be used to provide large area contacts for planar diodes, that is to say devices produced in a substrate by a technique similar to that described above for transistors, but in which diffusion into the substrate only takes place once to form the single rectifying junction.

Furthermore, the chromium gold film may be used, when deposited in a suitable pattern, to provide both large area contacts on the electrodes of a number of planar devices formed in a single silicon substrate and conductors between the electrodes of these devices, so as to form part of a solid-state circuit.

An alternative to chromium and gold in all the applications described above is to use manganese in place of chromium and silver in place of gold. An advantage in using manganese and silver is that manganese has a distinctly higher vapour pressure than silver; therefore the vacuum deposition of the graded film may be achieved by heating a single ingot containing more silver than manganese. The manganese will evaporate first alone, then both manganese and silver until finally only silver will remain in the ingot and a final layer of pure silver will be deposited.

All the examples above which describe an npn transistor structure could equally well apply to pnp structures. In this case, p, n, or $p^+$, should be read for n, p, or $n^+$.

An essential part of the planar process is the masking of the surface of the crystal for the purpose of diffusion. At the present time silicon is the most suitable semiconductor material for the masked diffusion process from the point of view of technique, because silicon has a stable dioxide which may be produced simply by steam and oxygen during each diffusion step. However, the applicability of the present invention can extend to other semiconductor crystals although with less ease of technique. For example with germanium, germanium oxide is less stable but it is possible to employ the planar process by depositing a silicon monoxide layer.

It is to be understood that the following description of specific examples of this invention is not to be considered as a limitation on its scope.

What we claim is:

1. A semiconductor device, comprising:
- a die of semiconductor material containing a barrier layer, having a region of one conductivity type extending to a given surface of said die;
- a layer of insulating material on said given surface having an aperture therein exposing a surface portion of said region;
- an electrode overlying and in ohmic contact with said exposed surface portion; and
- a metallic film overlying said insulating layer and making electrical contact to said electrode, said film including a continuously graded layer of a composite of two metals,
  - one of said metals being adhesive to said electrode and to said insulating layer,
  - the other of said metals being soft solderable, the grading of said layer being such that the relative proportion of said adhesive metal in the region of said film adjacent to said electrode and to said insulatig layer is substantially greater than said proportion in the region of said film furtherest removed from said electrode and insulating layer.

2. A device according to claim 1, wherein said electrode comprises a thin layer of aluminium.

3. A device according to claim 1, wherein said electrode comprises a thin surface layer of low resistivity semiconductor material of said one conductivity type.

4. A device according to claim 1, wherein said adhesive metal is chromium and said soft solderable metal is gold.

5. A device according to claim 4, wherein said proportion is 100% chromium in said adjacent region.

6. A device according to claim 4, wherein said proportion is 100% gold in said furthest removed region.

7. A device according to claim 4, wherein said proportion is 100% chromium in said adjacent region and 100% gold in said furthest removed region.

8. A device according to claim 1, wherein said adhesive metal is manganese and said soft solderable metal is gold.

9. A device according to claim 1, wherein said film is formed by depositing said metals simultaneously from the vapor state, and varying the relative proportions of said metal vapors while said deposition progresses.

References Cited by the Examiner

UNITED STATES PATENTS

| | | | |
|---|---|---|---|
| 2,973,466 | 2/1961 | Atalla et al. | 317—240 |
| 3,199,002 | 8/1965 | Martin | 317—234 |

JOHN W. HUCKERT, *Primary Examiner.*

M. EDLOW, *Assistant Examiner.*